United States Patent
Nguyen et al.

(10) Patent No.: US 7,269,066 B2
(45) Date of Patent: Sep. 11, 2007

(54) PROGRAMMING MEMORY DEVICES

(75) Inventors: Dzung H. Nguyen, Fremont, CA (US); Benjamin Louie, Fremont, CA (US); Hagop A. Nazarian, San Jose, CA (US); Aaron Yip, Santa Clara, CA (US); Jin-Man Han, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 11/126,790

(22) Filed: May 11, 2005

(65) Prior Publication Data

US 2006/0256620 A1 Nov. 16, 2006

(51) Int. Cl.
*G11C 16/04* (2006.01)

(52) U.S. Cl. .................... 365/185.17; 365/185.18; 365/185.19

(58) Field of Classification Search ........... 365/185.17, 365/185.18, 185.19
See application file for complete search history.

(56) References Cited

U.S. PATENT DOCUMENTS

| 5,440,505 | A | 8/1995 | Fazio |
| 6,804,150 | B2 | 10/2004 | Park et al. |
| 2002/0114187 | A1 | 8/2002 | Choi et al. |
| 2003/0135689 | A1 | 7/2003 | Fan |
| 2004/0095807 | A1 | 5/2004 | Suh |
| 2005/0219896 | A1* | 10/2005 | Chen et al. ............ 365/185.03 |

FOREIGN PATENT DOCUMENTS

WO    WO 2005/010638 A2    2/2005

* cited by examiner

*Primary Examiner*—Huan Hoang
(74) *Attorney, Agent, or Firm*—Leffert Jay & Polglaze, P.A.

(57) ABSTRACT

A target memory cell of a memory device is programmed by applying a programming voltage to a word line that includes the target memory cell, determining whether the target memory cell is programmed, and increasing the programming voltage by a step voltage if it is determined that the target memory cell is not programmed. An initial programming voltage and the step voltage are each selectable after fabrication of the memory device.

44 Claims, 3 Drawing Sheets

PROGRAMMING MEMORY DEVICES

TECHNICAL FIELD OF THE INVENTION

The present invention relates generally to memory devices and in particular the present invention relates to programming memory devices.

BACKGROUND OF THE INVENTION

A typical flash memory comprises a memory array that includes a large number of memory cells. Each of the memory cells includes a floating gate embedded in a MOS transistor. The cells are usually grouped into sections called "erase blocks." Each of the cells within an erase block can be electrically programmed selectively by tunneling charges to the floating gate. The negative charge is typically removed from the floating gate by a block erase operation, wherein all floating gate memory cells in the erase block are erased in a single operation.

Two common types of flash memory array architectures are the "NAND" and "NOR" architectures, so called for the resemblance which the basic memory cell configuration of each architecture has to a basic NAND or NOR gate circuit, respectively. In the NOR array architecture, the floating gate memory cells of the memory array are arranged in a matrix. The gates of each floating gate memory cell of the array matrix are connected by rows to word select lines (word lines) and their drains are connected to column bit lines. The source of each floating gate memory cell is typically connected to a common source line. The NOR architecture floating gate memory array is accessed by a row decoder activating a row of floating gate memory cells by selecting the word line connected to their gates. The row of selected memory cells then place their stored data values on the column bit lines by flowing a differing current if in a programmed state or non-programmed state from the connected source line to the connected column bit lines.

A NAND array architecture also arranges its array of floating gate memory cells in a matrix such that the gates of each floating gate memory cell of the array are connected by rows to word lines. However, each memory cell is not directly connected to a source line and a column bit line. Instead, the memory cells of the array are arranged together in strings, typically of 8, 16, 32, or more each, where the memory cells in the string are connected together in series, source to drain, between a common source line and a column bit line. The NAND architecture floating gate memory array is then accessed by a row decoder activating a row of floating gate memory cells by selecting the word select line connected to their gates. The word lines connected to the gates of the unselected memory cells of each string are driven to operate as pass transistors, allowing them to pass current in a manner that is unrestricted by their stored data values. Current then flows from the source line to the column bit line through each floating gate memory cell of the series connected string, restricted only by the memory cells of each string that are selected to be read. Thereby placing the current encoded stored data values of the row of selected memory cells on the column bit lines.

Two common programming techniques for NAND architecture Flash memories are the "boosted bit line" and the "boosted source line." In these techniques a high voltage is applied to the gate of a selected floating gate transistor of a string, while the remaining transistors are turned on in a pass through mode, from either the connected bit line or from a source line connected to the opposite end of the string of floating gate transistors.

As devices continue to reduce dimensions, the ranges of threshold voltage corresponding to individual data values are also becoming smaller. This makes programming more difficult as the differentiation between data values becomes less distinct.

SUMMARY

For one embodiment, the invention provides a method of programming a target memory cell of a memory device, including applying a programming voltage to a word line that includes the target memory cell, determining whether the target memory cell is programmed, and increasing the programming voltage by a step voltage if it is determined that the target memory cell is not programmed. An initial programming voltage and the step voltage are each selectable after fabrication of the memory device.

For another embodiment, the invention provides a memory device including an array of memory cells, a first register for storing a value corresponding to an initial programming voltage, a second register for storing a value corresponding to a voltage step, and control circuitry coupled to the array of memory cells and the first and second registers. The control circuitry is adapted to iteratively apply a programming voltage to a control gate of a target memory cell during programming of the target memory cell, to apply a programming voltage substantially equal to the initial programming voltage on a first iteration, and to increase the programming voltage by an amount substantially equal to the voltage step during successive iterations. The first and second registers are programmable after fabrication.

Further embodiments of the invention include methods and apparatus of varying scope.

DETAILED DESCRIPTION

Figure 1:
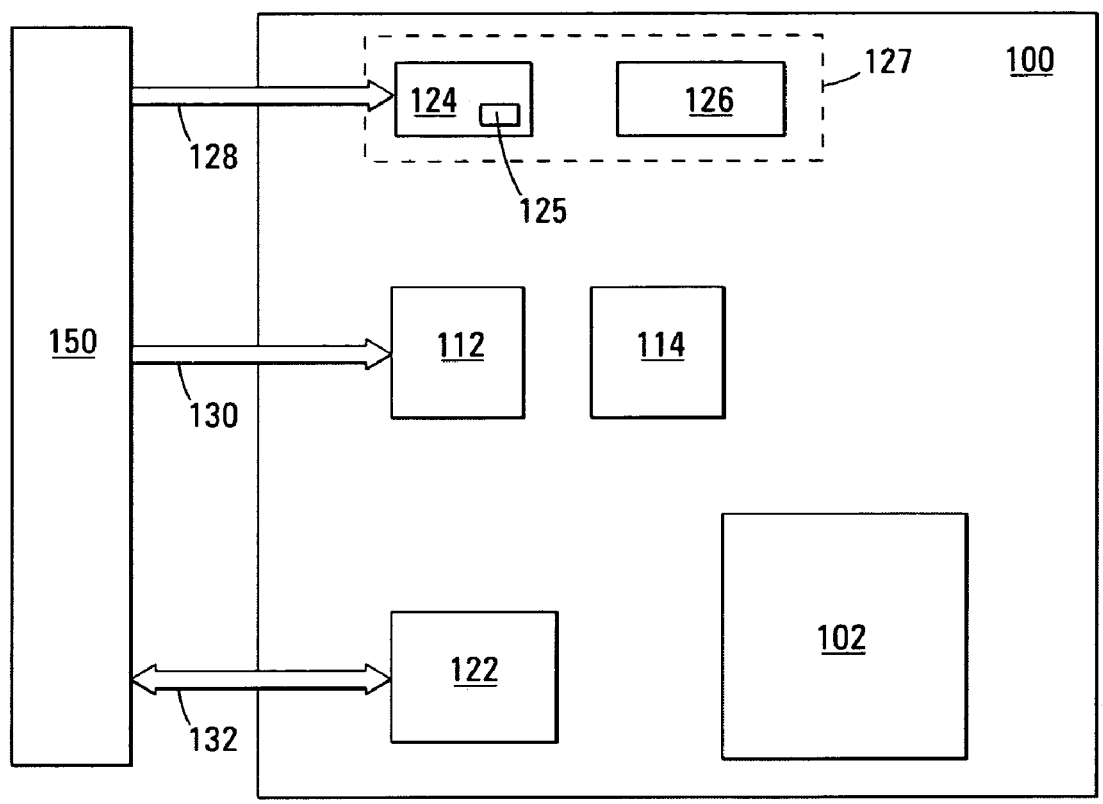
FIG. 1 is a block diagram illustration of a memory system, according to an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a block diagram illustration of a memory system, according to an embodiment of the present invention. The memory system includes a memory device 100, such as a flash memory device, e.g., NAND flash. Memory device 100 includes a memory array 102 having a plurality of memory cells arranged in row and column fashion. For one embodiment, each of the memory cells may include a floating-gate field-effect transistor capable of holding a charge for the non-volatile storage of data. Each of the cells may be electrically programmed on an individual basis by charging the floating gate.

The rows of memory array 102 may be arranged in blocks, where a memory block is some discrete portion of the memory array 102. Individual word lines generally extend to only one memory block, while bit lines may extend to multiple memory blocks. The memory cells generally can be erased in blocks. Data, however, may be stored in the memory array 102 separate from the block structure.

Memory array 102 can be accessed using externally provided location addresses received by an address register 112 via address signal connections 130. The address signals are decoded, and one or more target memory cells are selected in response to the decoded address signals, using the access circuitry 114 that includes decode and select circuitry.

Data is input and output through an I/O circuit 122 via data connections 132. I/O circuit 122 includes data output registers, output drivers, and output buffers. Command execution logic 124 is provided to control the basic operations of the memory device 100 in response to control signals received via control signal connections 128. For one embodiment, command execution logic 124 includes trim circuitry 125. Trim circuitry 125 is adapted to store control parameter values used by state machine 226 for controlling operations on memory array 102. A state machine 126, that in one embodiment includes high-voltage generation circuitry, may also be provided to control specific operations performed on the memory array and the memory cells. The command execution logic 124 and/or state machine 126 can be generally referred to as control circuitry 127 to control read, write, erase and other memory operations. The control circuitry 127 is adapted to facilitate the methods of the various embodiments. The data connections 132 are typically used for bi-directional data communication. The memory can be coupled to an external processor 150 for operation. An example of a processor 150 includes a memory controller in a personal computer.

Trim circuitry 125 is adapted to store control parameter values used by state machine 126 for controlling operations on memory array 102. Specifically, trim circuitry 125 may include registers that can store the control parameter values after fabrication of the memory device. Exemplary control parameters include parameters for adjusting the magnitude and duration of voltage pulses applied to memory array 102 for carrying out programming and erasing operations.

It will be appreciated by those skilled in the art that additional circuitry and control signals can be provided, and that the memory device of FIG. 1 has been simplified to help focus on the invention. It will further be understood that the above description of a memory device is intended to provide a general understanding of the memory and is not a complete description of all the elements and features of a typical memory device.

Figure 2:
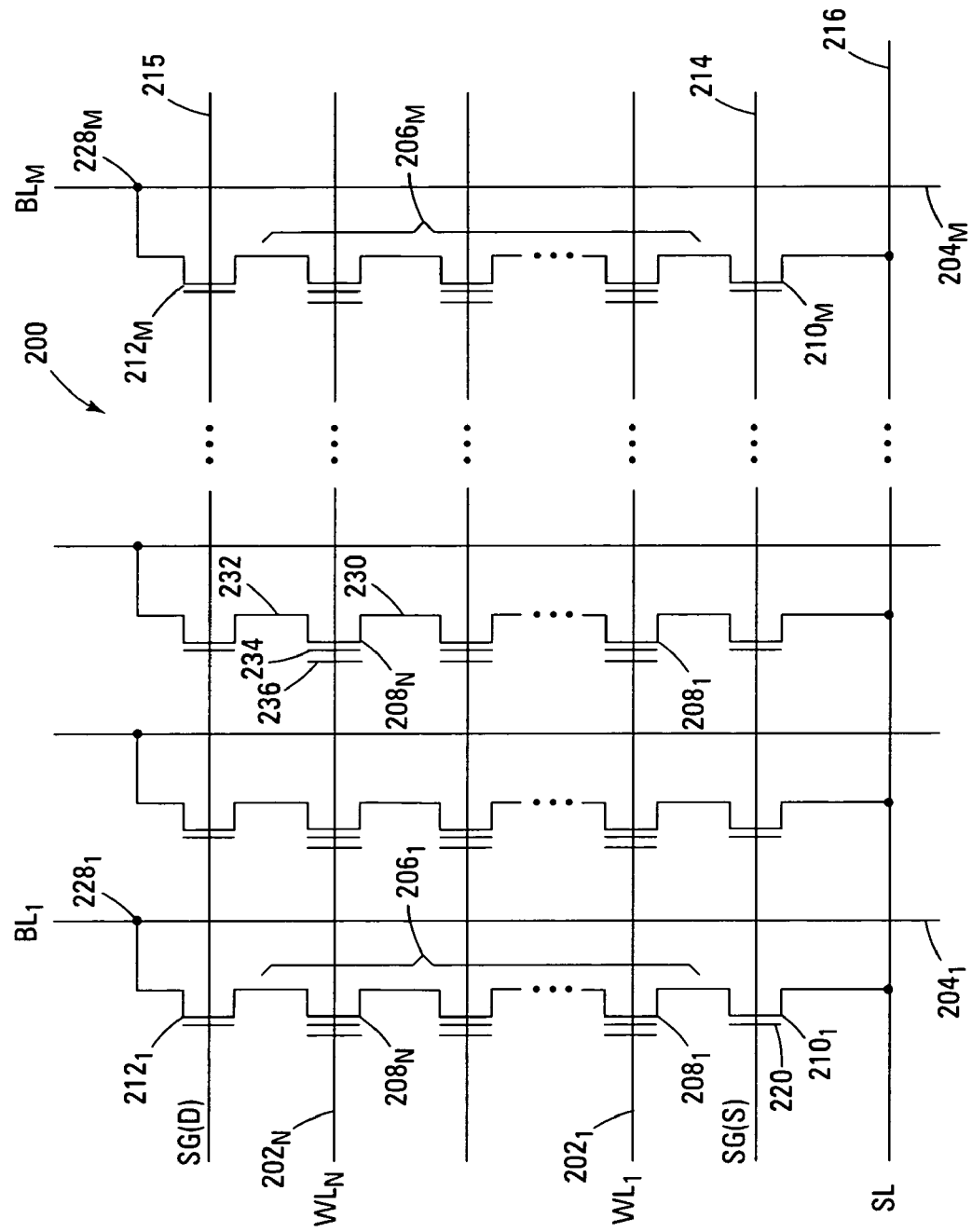
FIG. 2 illustrates a memory array, according to another embodiment of the invention.

FIG. 2 illustrates a NAND memory array 200 as a portion of memory array 102 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes floating gate transistors $208_1$ to $208_N$, each located at an intersection of a word line 202 and a local bit line 204. The floating gate transistors 208 represent non-volatile memory cells for storage of data. The floating gate transistors 208 of each NAND string 206 are connected in series, source to drain, between a source select gate 210, e.g., a field effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating gate transistor 208 of the corresponding NAND string 206. For example, the drain of source select gate $210_1$ is connected to the source of floating gate transistor $208_1$ of the corresponding NAND string $206_1$. A control gate 220 of each source select gate 210 is connected to source select line 214. It is common for a common source line to be connected between source select gates for NAND strings of two different NAND arrays. As such, the two NAND arrays share the common source line.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating gate transistor $208_N$ of the corresponding NAND string 206. For example, the source of drain select gate $212_1$ is connected to the drain of floating gate transistor $208_N$ of the corresponding NAND string $206_1$. It is common for two NAND strings to share the same drain contact.

Typical construction of floating gate transistors 208 includes a source 230 and a drain 232, a floating gate 234, and a control gate 236, as shown in FIG. 2. Floating gate transistors 208 have their control gates 236 coupled to a word line 202. A column of the floating gate transistors 208 is a NAND string 206 coupled to a given local bit line 204. A row of the floating gate transistors 208 are those transistors commonly coupled to a given word line 202.

Figure 3:
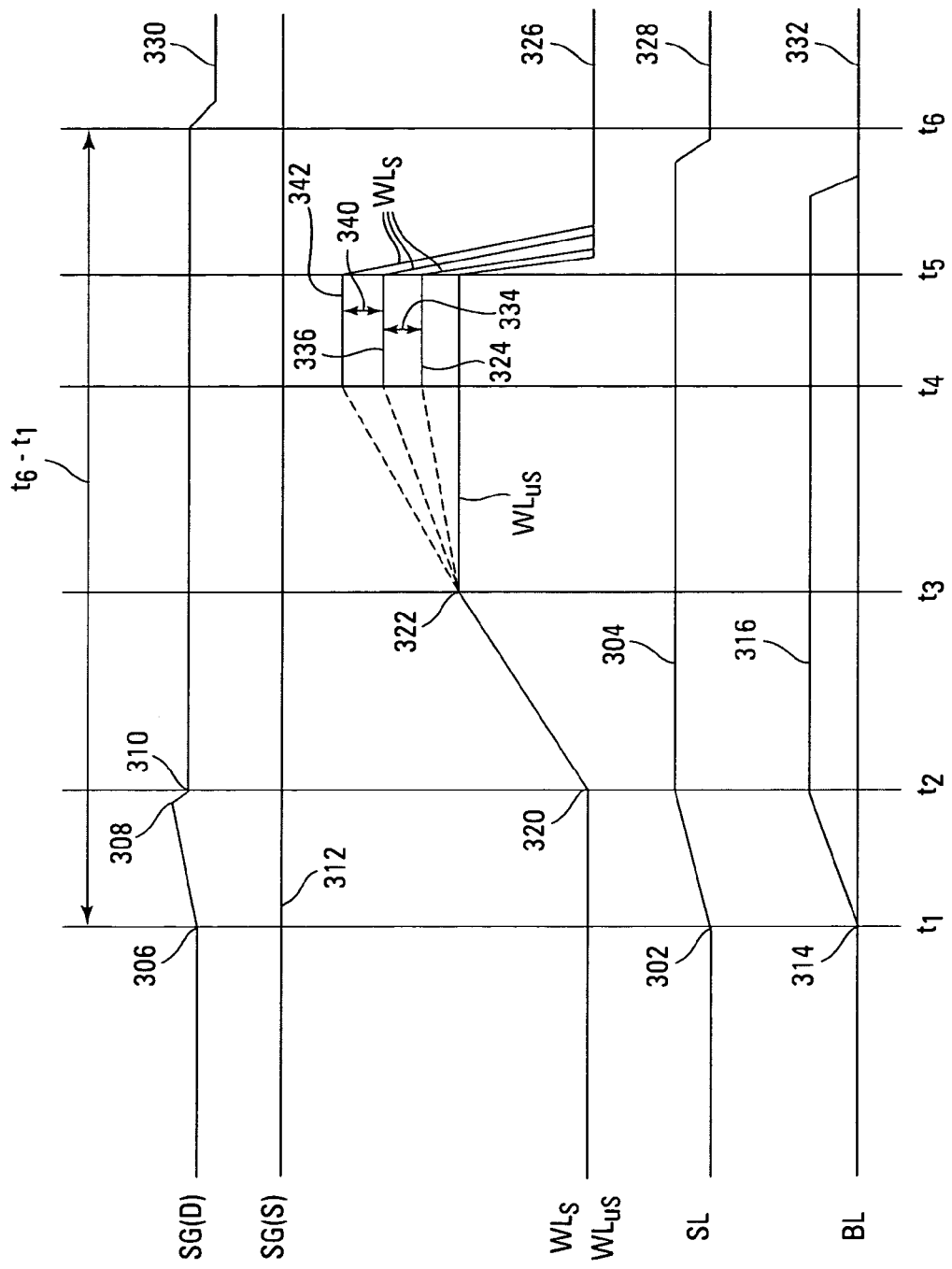
FIG. 3 illustrates waveforms applied to a memory array, according to another embodiment of the invention.

FIG. 3 illustrates waveforms applied to a memory array, such as memory array 200 of FIG. 2, for programming a target memory cell of a word line that includes the target memory cell. Starting at a time $t_1$, a voltage SL of source line 216 is increased from a voltage level 302, e.g., about 0 volts, to a voltage level 304, such as Vcc, e.g., about 1.8 volts, at a time $t_2$. During the time interval between times $t_1$ and $t_2$, a voltage SG(D) of drain select line 215 and thus of the control gates of each of drain select gates 212 is increased from a voltage level 306, e.g., about Vss or 0 volts, to a peak voltage level 308, e.g., Vcc, and then is decreased to a voltage level 310 at time $t_2$. For one embodiment, voltage level 310 is programmed into a register, e.g., of trim circuitry 125 of memory device 100, after fabrication of memory device 100. For another embodiment, the register is a two-bit register that can be programmed to store four different control parameter values corresponding to voltage level 310.

During programming, a voltage SG(S) of source select line 215 and thus of the control gates of each of source select gates 212 is maintained at voltage level 312, e.g., Vss or 0 volts. A voltage BL of bit lines 204 is either maintained at a voltage level 314, e.g., of 0 volts, for programming a logic low or is increased from voltage level 314 at time $t_1$ to a voltage level 316, such as 1.8 volts, at time $t_2$. Voltage level 316 corresponds to an inhibit voltage to prevent programming to keep selected memory cells of the bit lines in an erased state and thus leave them unchanged, e.g., at a logic high. For one embodiment, the length the time interval between times $t_1$ and $t_2$ is fixed or hard programmed during fabrication of the memory device, e.g., using a metal option.

It will be appreciated by those skilled in the art that the voltage BL can be maintained at voltage level 332 for one or more first bit lines for programming a selected memory cell of each of the one or more first bit lines to a logic low value, and the voltage BL can be increased to voltage level 316 for one or more second bit lines for effectively programming (maintaining) a selected memory cell of each of the one or more second bit lines to a logic high value.

Starting at a time $t_2$, a voltage $WL_{US}$ of one or more word lines 202 that do not include the target memory cell is increased from a voltage level 320, e.g., about 0 volts, to a voltage level 322 at a time $t_3$ and remains at voltage level 322 until time $t_5$. For this situation, voltage level 322 is not sufficient for programming the memory cells and is typically referred to as a pass voltage. This pass voltage has the effect of turning the memory cells of the one or more word lines that do not include the target memory cell to an ON condition regardless of the programmed state of their internal floating gate, allowing them to pass the bit line voltage BL of a bit line to the target memory cell. For one embodiment, voltage level 322 is programmed into a register, e.g., of trim circuitry 125 of memory device 100, after fabrication of memory device 100. For another embodiment, the register is a two-bit register that can be programmed to store four different control parameter values corresponding to voltage level 322.

The voltage $WL_S$ of the word line (hereinafter called the selected word line) that includes the target memory cell is increased from voltage level 320 at time $t_2$ to voltage level 322 at time $t_3$. The voltage $WL_S$ of the selected word line is further increased from voltage level 322 at time $t_3$ to an initial programming voltage level 324 at a time $t_4$ and is maintained at voltage level 324 until time $t_5$. For one embodiment, the initial programming voltage level 324 is programmed into a register, e.g., of trim circuitry 125 of memory device 100, after fabrication of memory device 100. For another embodiment, the register is a two-bit register that can be programmed to store four different control parameter values corresponding to the initial programming voltage level 324.

For one embodiment, the length of the time interval between times $t_2$ and $t_3$ is programmed into a register, e.g., of trim circuitry 125 of memory device 100, after fabrication of memory device 100. For another embodiment, the register is a two-bit register that can be programmed to store four different control parameter values corresponding to the length of the time interval between times $t_2$ and $t_3$. Note that the length of the time interval between times $t_2$ and $t_3$ is the time allowed for the voltage $WL_{US}$ applied to the one or more unselected word lines and the voltage $WL_S$ applied to the selected word line to increase from voltage level 320 to voltage level 322, i.e., the pass voltage. For another embodiment, the length of the time interval between times $t_3$ and $t_5$ is programmed into a register, e.g., of trim circuitry 125 of memory device 100, after fabrication of memory device 100. For another embodiment, the register is a two-bit register that can be programmed to store four different control parameter values corresponding to the length of the time interval between times $t_3$ and $t_5$. Note that the length of the time interval between times $t_3$ and $t_5$ is the time that the programming voltage is applied to the selected word line.

At time $t_5$, voltage $WL_S$ is discharged from initial programming voltage level 324 to a voltage level 322, and voltages $WL_S$ and $WL_{US}$ are discharged from voltage level 322 to a voltage level 326, e.g., about 0 volts. A program verify is performed, starting after a time $t_6$. Note that voltages SL and SG(D) are respectively discharged from voltage levels 304 and 310 to voltage levels 328 and 330, e.g., about 0 volts, after voltage $WL_S$ and voltage $WL_{US}$ are discharged for one embodiment. For another embodiment, voltage SG(D) is discharged, starting at time $t_6$, before the program verify, as shown in FIG. 6. Note further that the voltage BL is discharged from voltage level 316 to a voltage level 332, e.g., about 0 volts after voltage $WL_S$ and voltage $WL_{US}$ are discharged for one embodiment.

If the program verify indicates that the target memory cell of the selected word line is programmed, the programming is completed. Otherwise, another attempt is made to program the target memory cell of the selected word line by setting the voltages BL, SL, $WL_{US}$, SG(S), and SG(D) as described above and shown in FIG. 3. However, for this programming attempt, a step voltage 334 is added to the initial programming voltage level 324 so that voltage $WL_S$ increases, from voltage level 320 at time $t_2$ to voltage level 322 at time $t_3$, for one embodiment, and subsequently increases from voltage level 322 at time $t_3$ to a second programming voltage level 336 at a time $t_4$, and remains at voltage level 336 until time $t_5$. Note that the difference between the initial programming voltage level 324 and the second programming voltage level 336 is step voltage 334. At time $t_5$ and thereafter, the process proceeds as described above and shown in FIG. 3. In particular, voltage $WL_S$ is discharged from initial programming voltage level 336 to voltage level 322; voltages $WL_S$ and $WL_{US}$ are discharged from voltage level 322 to voltage level 326; and a program verify is performed, starting after time $t_6$.

If the program verify indicates that the target memory cell of the selected word line is programmed, the programming is completed. Otherwise, another attempt is made to program the target memory cell of the selected word line by setting the voltages BL, SL, $WL_{US}$, SG(S), and SG(D) as described above and shown in FIG. 3 and incrementing voltage $WL_S$ from the second programming voltage level 336 by a voltage step 340 to a third programming voltage level 342, as shown in FIG. 3, and the above-described process is repeated to determine whether the target memory cell of the selected word line is programmed. This is repeated in an iterative process until the target memory cell of the selected word line is programmed.

For one embodiment, the voltage steps are programmed in a register, e.g., using trim circuitry 125 of memory device 100, after fabrication of memory device 100. For another embodiment, the register is a two-bit register that can be programmed to store four different control parameter values corresponding to the voltage steps.

Note that when the voltage BL applied to the bit line that is coupled to a NAND string that includes the target memory cell is maintained at the voltage level 314, the difference between the programming voltage and the voltage BL is such that the target memory cell can be programmed when programming voltage reaches an appropriate value. However, when the voltage BL applied to the bit line that is coupled to a NAND string that includes the target memory cell is at the voltage level 316, e.g., an inhibit voltage, the difference between the programming voltage and the voltage BL is such that the target memory cell is prevented from being programmed, e.g., the target memory remains in an erased state.

CONCLUSION

The invention allows for to compensating for variations in processing by allowing a variety of initial values and incremental changes in the programming voltages/times. By permitting variations of initial programming voltages and incremental changes, the performance of the device may be tuned after fabrication. It may even facilitate devices with different performance characteristics, allowing the fabricator to provide variations in programming speed without requiring multiple inventories of devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of programming a target memory cell of a memory device, comprising:
    programming a plurality of initial programming voltages into the memory device after fabrication of the memory device;
    programming a step voltage into the memory device after fabrication of the memory device;
    selecting one of the plurality of the programmed initial programming voltages;
    applying a programming voltage substantially equal to the selected one of the plurality of the programmed initial programming voltages to a word line that includes the target memory cell;
    determining whether the target memory cell is programmed; and
    increasing the programming voltage by the programmed step voltage if it is determined that the target memory cell is not programmed.

2. The method of claim 1, wherein programming a step voltage into the memory device after fabrication of the memory device comprises programming a plurality of step voltages into the memory device after fabrication of the memory device and selecting one of the plurality of step voltages.

3. The method of claim 1 further comprises applying a pass voltage to word lines that do not include the target memory cell while applying the programming voltage to the word line that includes the target memory cell, wherein the pass voltage is insufficient for programming memory cells and activates memory cells of the word lines that do not include the target memory cell.

4. The method of claim 3, wherein the pass voltage is selectable after fabrication of the memory device.

5. The method of claim 4, wherein the pass voltage is selected from a plurality of pass voltages.

6. The method of claim 3 further comprises setting a length of a time allowed for a voltage applied to word lines that do not include the target memory cell and a voltage applied to the word line that includes the target memory cell to increase from an initial level to the pass voltage.

7. The method of claim 6, wherein the length of a time is selectable after fabrication of the memory device.

8. The method of claim 7, wherein setting the length of the time comprises selecting the length of time from a plurality of lengths of time.

9. The method of claim 1 further comprises applying a voltage to a source line selectively coupled, by a source select gate, to a NAND string of memory cells that includes the target memory cell.

10. The method of claim 9, wherein applying a voltage to the source line comprises applying Vcc to the source line.

11. The method of claim 1 further comprises applying a voltage to a drain select line coupled to a control gate of a drain select gate that selectively couples a bit line to a NAND string of memory cells that includes the target memory cell.

12. The method of claim 11, wherein applying the voltage to the drain select line comprises increasing the voltage to the drain select line from a first voltage level to a second voltage level and decreasing the voltage to the drain select line from the second level to a third voltage level, wherein the third voltage level is applied to the drain select line while applying the programming voltage to the word line that includes the target memory cell.

13. The method of claim 12, wherein the third voltage level is selectable after fabrication of the memory device.

14. The method of claim 13, wherein the third voltage level is selected from a plurality of third voltage levels.

15. The method of claim 12, wherein the second voltage level is Vcc.

16. The method of claim 15, wherein the third voltage is between Vss and Vcc.

17. The method of claim 1 further comprises applying a voltage to a source select line coupled to a control gate of a source select gate that selectively couples a source line to a NAND string of memory cells that includes the target memory cell.

18. The method of claim 17, wherein applying the voltage to the source select line comprises applying Vss to the source select line.

19. The method of claim 1 further comprises applying a voltage to a bit line selectively coupled to a NAND string of memory cells that includes the target memory cell.

20. The method of claim 19, wherein applying the voltage to the bit line comprises applying an inhibit voltage to the bit line to prevent programming of the target memory cell.

21. The method of claim 1 further comprises setting a length of a time that the programming voltage is applied to the word line that includes the target memory cell.

22. The method of claim 21, wherein the length of a time is selectable after fabrication of the memory device.

23. The method of claim 22, wherein setting the length of the time comprises selecting the length of time from a plurality of lengths of time.

24. A method of programming a target memory cell of a memory device, comprising:
    programming a plurality of initial programming voltages into the memory device after fabrication of the memory device;
    programming a step voltage into the memory device after fabrication of the memory device;
    selecting one of the plurality of the programmed initial programming voltages;
    applying a programming voltage substantially equal to the selected one of the plurality of the programmed initial programming voltages to a word line that includes the target memory cell;
    applying a pass voltage to word lines that do not include the target memory cell while applying the programming voltage to the word line that includes the target memory cell for turning on memory cells of the word lines that do not include the target memory cell;

applying a voltage to a bit line selectively coupled to a NAND string of memory cells that includes the target memory cell;

determining whether the target memory cell is programmed; and increasing the programming voltage by the programmed step voltage if it is determined that the target memory cell is not programmed.

25. The method of claim 24, wherein applying the voltage to the bit line comprises applying about 0 volts to the bit line.

26. The method of claim 24, wherein applying the voltage to the bit line comprises applying an inhibit voltage to the bit line to prevent programming of the target memory cell.

27. The method of claim 24 further comprises applying a voltage to a drain select line coupled to a control gate of a drain select gate that selectively couples the bit line to the NAND string that includes the target memory cell, wherein the voltage applied to the drain select line is selectable after fabrication of the memory device.

28. The method of claim 24 further comprises setting a length of a time allowed for a voltage applied to word lines that do not include the target memory cell and a voltage applied to the word line that includes the target memory cell to increase from an initial level to the pass voltage, wherein the length of time is selectable after fabrication of the memory device.

29. The method of claim 24 further comprises setting a length of a time that the programming voltage is applied to the word line that includes the target memory cell, wherein the length of time is selectable after fabrication of the memory device.

30. The method of claim 24 further comprises applying Vss to a source select line coupled to a control gate of a source select gate that selectively couples a source line to the NAND string of memory cells that includes the target memory cell.

31. The method of claim 24 further comprises applying Vcc to a source line selectively coupled, by a source select gate, to the NAND string of memory cells that includes the target memory cell.

32. The method of claim 24 further comprises programming the pass voltage into the memory device after fabrication of the memory device.

33. The method of claim 32, wherein programming the step voltage comprises programming a plurality of step voltages into the memory device after fabrication of the memory device and selecting one of the plurality of step voltages and wherein the pass voltage is selected from a plurality of pass voltages.

34. A memory device, comprising:
an array of memory cells;
a first register for storing a value corresponding to an initial programming voltage;
a second register for storing a value corresponding to a voltage step; and
control circuitry coupled to the array of memory cells and the first and second registers;
wherein the control circuitry is adapted to iteratively apply a programming voltage to a control gate of a target memory cell during programming of the target memory cell;
wherein the control circuitry is adapted to apply a programming voltage substantially equal to the initial programming voltage on a first iteration;
wherein the control circuitry is adapted to increase the programming voltage by an amount substantially equal to the voltage step during successive iterations; and
wherein the first and second registers are programmable after fabrication.

35. The memory device of claim 34, wherein the first and second registers are two-bit registers.

36. The memory device of claim 34, wherein the control circuitry is adapted to apply a pass voltage to control gates of non-target memory cells.

37. The memory device of claim 36 further comprises a third register coupled to the control circuitry for storing a value corresponding to the pass voltage.

38. The memory device of claim 37, wherein the third register is programmable after fabrication.

39. The memory device of claim 37, wherein the third register is a two-bit register.

40. The memory device of claim 36, wherein the control circuitry is adapted to set a length of a time allowed for a voltage applied to the control gates of non-target memory cells and a voltage applied to the control gate of the target memory cell to increase from an initial level to the pass voltage.

41. The memory device of claim 40 further comprises a third register coupled to the control circuitry for storing a value corresponding to the length of time allowed for a voltage applied to the control gates of non-target memory cells and a voltage applied to the control gate of the target memory cell to increase from an initial level to the pass voltage.

42. The memory device of claim 41, wherein the third register is a two-bit register.

43. The memory device of claim 34, wherein the control circuitry is adapted to set a length of the time interval during which the programming voltage is applied to the control gate of the target memory cell.

44. The memory device of claim 43 further comprises a third register coupled to the control circuitry for storing a value corresponding to the length of a time interval during which the programming voltage is applied to the control gate of the target memory cell.

* * * * *